United States Patent
Yoshiya

(10) Patent No.: US 10,302,461 B2
(45) Date of Patent: May 28, 2019

(54) ROTATION DETECTION DEVICE

(71) Applicants: MELEXIS TECHNOLOGIES NV, Tessenderlo (BE); K. K. MELEXIS JAPAN TECHNICAL RESEARCH CENTER, Yokohama-shi, Kanagawa (JP)

(72) Inventor: Takumi Yoshiya, Yokohama (JP)

(73) Assignee: MELEXIS TECHNOLOGIES SA, Bevaix (CH)

(*) Notice: Subject to any disclaimer, the term of this patent is extended or adjusted under 35 U.S.C. 154(b) by 7 days.

(21) Appl. No.: 15/550,041

(22) PCT Filed: Feb. 18, 2016

(86) PCT No.: PCT/JP2016/054665
§ 371 (c)(1),
(2) Date: Aug. 10, 2017

(87) PCT Pub. No.: WO2016/136574
PCT Pub. Date: Sep. 1, 2016

(65) Prior Publication Data
US 2018/0031392 A1    Feb. 1, 2018

(30) Foreign Application Priority Data
Feb. 24, 2015 (JP) ................. 2015-034007

(51) Int. Cl.
*G01D 5/245* (2006.01)
*G01D 5/14* (2006.01)
*G01R 33/07* (2006.01)

(52) U.S. Cl.
CPC ............ *G01D 5/245* (2013.01); *G01D 5/147* (2013.01); *G01R 33/072* (2013.01); *G01D 5/2451* (2013.01)

(58) Field of Classification Search
CPC ...... G01D 5/245; G01D 5/147; G01D 5/2451; G01R 33/072
(Continued)

(56) References Cited

U.S. PATENT DOCUMENTS

2002/0021124 A1  2/2002 Schott et al.
2012/0007598 A1  1/2012 Lo et al.
(Continued)

FOREIGN PATENT DOCUMENTS

JP  2002-71381 A   3/2002
JP  2006-145528 A  6/2006
(Continued)

OTHER PUBLICATIONS

Japanese Office Action issued by JPO to the corresponding Japanese application No. 2015-034007 dated Nov. 27, 2017.
(Continued)

*Primary Examiner* — Melissa J Koval
*Assistant Examiner* — Trung Nguyen
(74) *Attorney, Agent, or Firm* — Hauptman Ham, LLP

(57) ABSTRACT

To provide a rotation detection device that has a miniaturized sensor IC in comparison with a prior art.
A rotation detection device includes: a magnet that forms a magnetic field toward a tooth surface of a gear; and a sensor disposed between the magnet and the gear, the sensor including: at least a pair of magnetic detection elements $_{x1}$ and $_{x2}$ that outputs signals according to a magnetic flux density in a radial direction of the gear; and a magnetic concentrator that induces, in the radial direction of the gear, a component in a circumferential direction of the gear in the magnetic flux density on detection surfaces of the magnetic detection elements $_{x1}$ and $_{x2}$, the sensor detecting a variation in a magnetic flux density accompanying the rotation of the gear.

18 Claims, 7 Drawing Sheets

(58) Field of Classification Search
USPC ........ 324/200, 207.2–207.25, 226, 631, 166, 324/160, 600, 167, 76.11
See application file for complete search history.

(56) References Cited

U.S. PATENT DOCUMENTS

2013/0249029 A1* 9/2013 Vig .................... G01R 33/0047
257/427
2014/0156220 A1* 6/2014 Okamoto ............. G01R 33/072
702/150

FOREIGN PATENT DOCUMENTS

| JP | 2009-516186 A | 4/2009 |
| JP | 2014-98717 A | 5/2014 |
| JP | 2014-145777 A | 8/2014 |

OTHER PUBLICATIONS

International Search Report dated May 17, 2016 for PCT/JP2016/054665.
Allegro Micro Systems LLC, "True Zero-Speed, High Accuracy Gear Tooth Sensor IC", ATS667LSG, total 14 pages.

* cited by examiner

ROTATION DETECTION DEVICE

CROSS REFERENCE TO RELATED APPLICATION

This application claims the priority of Japanese Patent Application No. 2015-034007 filed on Feb. 24, 2015, in the JPO (Japanese Patent Office). Further, this application is the National Phase application of International Application No. PCT/JP2016/054665 filed Feb. 18, 2016, which designates the United States and was published in Japan. Two of the priority documents are hereby incorporated by reference in their entireties.

TECHNICAL FIELD

The present invention relates to a rotation detection device.

BACKGROUND ART

As a conventional technology, a rotation detection device that detects the rotation of a gear by using a differential Hall sensor has been proposed (see Non-Patent Literature 1, for example).

The rotation detection device disclosed in Non-Patent Literature 1 includes a magnet that forms a magnetic field toward the tooth surface of a gear, and a sensor IC (ATS667LSG) disposed between the gear and the magnet and provided with a pair of magnetic detection elements for detecting a variation in the magnetic flux density accompanying the rotation of the gear in the radial direction of the gear, the sensor outputting a difference in the outputs from the pair of magnetic detection elements. With the rotation of the gear, a signal which is output from the sensor IC is periodically changed, whereby the rotating speed, angular speed, and the like of the gear can be detected.

CITATION LIST

Non-Patent Literature

Non-Patent Literature 1: Allegro Micro Systems LLC, "ATS667LSG Data Sheet", [online], [searched on Feb. 16, 2015], Internet <URL:http://www.allegromicro.com/en/Products/Magnetic-Speed-Sensor-ICs/Transmission-Sensor-ICs/ATS667.aspx>

SUMMARY OF INVENTION

Technical Problem

However, the rotation detection device disclosed in Non-Patent Literature 1 uses the difference between the outputs from a pair of magnetic detection elements as an output signal, and to obtain a sufficient signal intensity, the pair of magnetic detection elements needs to be separated from each other so that sufficient variation, accompanying the rotation of the gear, in the magnetic flux density passing through each of the pair of magnetic detection elements is obtained. Considering such situation, in the sensor IC described above, the distance between the pair of magnetic detection elements is 2.2 mm, and since there is a limitation in the arrangement of the pair of magnetic detection elements, the sensor IC entails a problem of incapable of being manufactured to be smaller than at least this distance. The miniaturization of the sensor IC is a significant problem from the viewpoint of the production cost of the sensor IC and the degree of freedom in the arrangement of the sensor IC.

In view of this, an object of the present invention is to provide a rotation detection device that has a miniaturized sensor IC in comparison with a prior art.

Solution to Problem

In order to attain the foregoing object, one aspect of the present invention provides a rotation detection device described below.

[1] A rotation detection device including: a magnet that forms a magnetic field toward a tooth surface of a gear; and a sensor disposed between the magnet and the gear, the sensor including: at least a pair of magnetic detection elements that outputs signals according to a magnetic flux density in a radial direction of the gear; and a magnetic concentrator that induces, in the radial direction of the gear, a component in a circumferential direction of the gear in the magnetic flux density on detection surfaces of the magnetic detection elements, the sensor detecting a variation in a magnetic flux density accompanying a rotation of the gear.

[2] The rotation detection device according to [1], wherein the sensor further includes a signal processing circuit that processes signals output from the pair of magnetic detection elements, and the sensor detects, from among variations in a magnetic field accompanying the rotation of the gear, a variation in a component in the circumferential direction of the gear in the magnetic flux density by signal processing.

[3] A rotation detection device including: a magnet that forms a magnetic field toward a tooth surface of a gear; and a sensor disposed between the magnet and the gear, the sensor including: at least a pair of magnetic detection elements that outputs signals according to a magnetic flux density in a radial direction of the gear; and a magnetic concentrator that induces, in the radial direction of the gear, a component in a direction orthogonal to a circumferential direction of the gear and the radial direction of the gear in the magnetic flux density on detection surfaces of the magnetic detection elements, the sensor detecting a variation in a magnetic flux density accompanying a rotation of the gear.

[4] The rotation detection device according to [3], wherein the sensor further includes a signal processing circuit that processes signals output from the pair of magnetic detection elements, and the sensor detects, from among variations in a magnetic field accompanying the rotation of the gear, a variation in a component in a direction orthogonal to the circumferential direction of the gear and the radial direction of the gear in the magnetic flux density by signal processing.

[5] The rotation detection device according to any one of [1] to [4], wherein the sensor has the magnetic concentrator disposed between the pair of magnetic detection elements.

[6] The rotation detection device according to any one of [1] to [4], wherein the sensor has the magnetic concentrator disposed on both ends of the pair of magnetic detection elements.

Advantageous Effects of Invention

According to the invention in claim 1 or 3, the sensor IC can be miniaturized in comparison with a prior art.

According to the invention in claim 2 or 4, a dynamic range can be improved in comparison with a prior art.

According to the invention in claim 5, the magnetic concentrator can be provided between the pair of magnetic detection elements.

According to the invention in claim 6, the magnetic concentrator can be provided on both ends of the pair of magnetic detection elements.

DESCRIPTION OF EMBODIMENTS

First Embodiment (Configuration of Rotation Detection Device)

Figure 1:
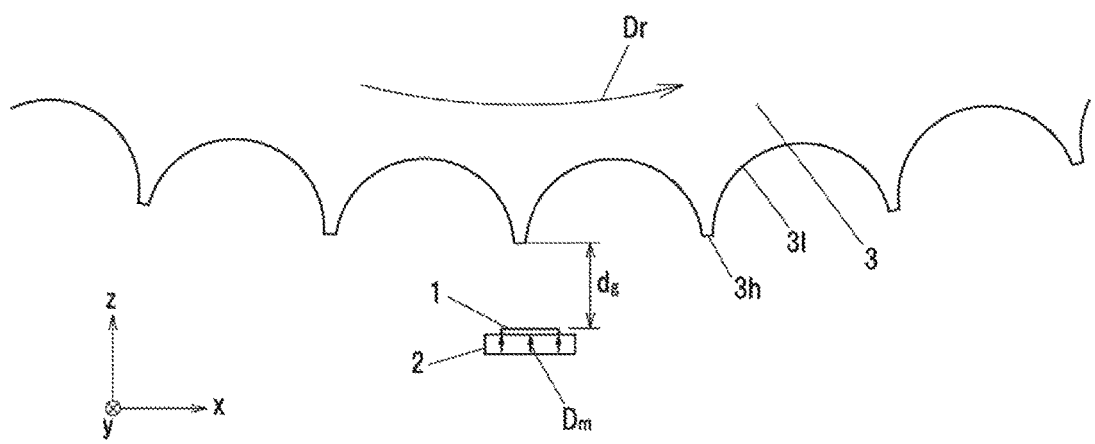
FIG. 1 is a side view illustrating an example of a configuration of a rotation detection device according to a first embodiment.
Figure 2A:
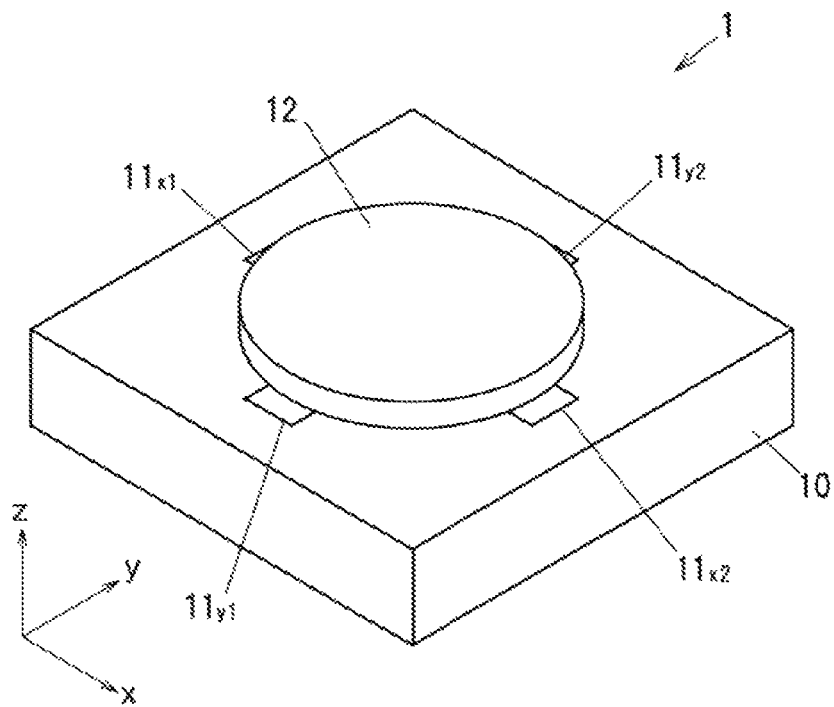
FIG. 2A is a perspective view and a sectional view illustrating the configuration of a sensor.
Figure 2B:
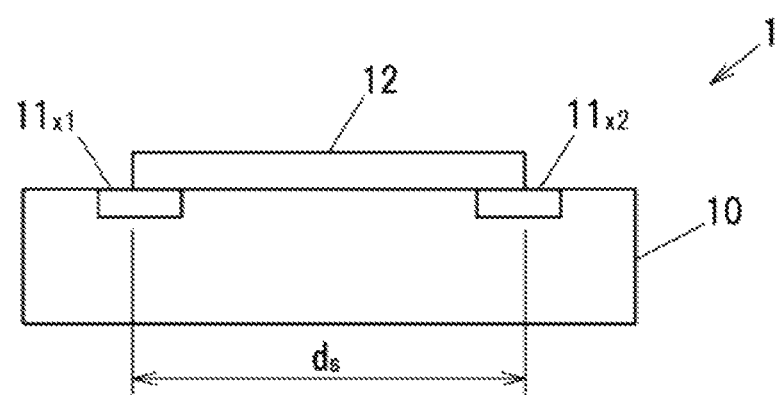
FIG. 2B is a perspective view and a sectional view illustrating the configuration of the sensor.

FIG. 1 is a side view illustrating an example of a configuration of a rotation detection device according to a first embodiment. FIGS. 2A and 2B are each a perspective view and a sectional view illustrating the configuration of a sensor 1.

A rotation detection device 5 includes the sensor 1 disposed with a gap $d_g$ from a tooth tip $3h$ of a gear 3, and a magnet 2 disposed on the back surface of the sensor 1 with the magnetization direction being defined as $D_m$.

As illustrated in FIGS. 2A and 2B, as one example, the sensor 1 includes: a flat plate substrate 10 having a thickness in a z direction; Hall elements $11_{x1}$, $11_{x2}$, $11_{y1}$, and $11_{y2}$ mounted on the substrate 10, having detection surfaces parallel to an xy plane, and having detection directions in the z direction as magnetic detection elements; a magnetic concentrator 12 that is mounted on the Hall elements $11_{x1}$, $11_{x2}$, $11_{y1}$, and $11_{y2}$ such that a portion thereof is overlapped with the Hall elements, the magnetic concentrator 12 converting a magnetic flux in an x direction and a y direction into a magnetic flux in the z direction for causing the Hall elements $11_{x1}$, $11_{x2}$, $11_{y1}$, and $11_{y2}$ to detect the converted magnetic flux; and a signal processing circuit (not illustrated) that processes signals output from the Hall elements $11_{x1}$, $11_{x2}$, $11_{y1}$, and $11_{y2}$. The sensor 1 is a Hall IC that detects the magnetic flux density in the x, y, and z directions.

The sensor 1, which is a Hall latch switch sensor manufactured by Melexis, or the like, obtains the difference between the output from the Hall element $11_{x1}$ and the output from the Hall element $11_{x2}$ and the difference between the output from the Hall element $11_{y1}$ and the output from the Hall element $11_{y2}$, thereby being capable of obtaining outputs in proportion to the magnetic flux density in the x direction and the magnetic flux density in the y direction. The relationship between the magnetic flux density and the output will be described later. In addition, the distance between the Hall elements $11_{x1}$ and $11_{x2}$ and the distance between the Hall elements $11_{y1}$ and $11_{y2}$ are set as ds=0.2 mm, and in a package mold section, the thickness in the z direction is 1.5 mm, the width in the x direction is 4.1 mm, and the height in the y direction is 3 mm. Permalloy can be used for the magnetic concentrator 12 of the sensor 1. Furthermore, the sensor 1 may not include Hall elements $11_{y1}$ and $11_{y2}$.

Notably, other types of elements such as an MR element may be used for the sensor 1, so long as they have the detection direction in the x direction, and a multi-axis magnetic detection IC having magnetic detection elements in a plurality of axial directions may be used, so long as it includes the detection direction in the x direction.

The magnet 2 is a permanent magnet formed by using a material such as ferrite, samarium-cobalt, or neodymium.

Note that various sizes of gears 3 can be used. Herein, the case of using the gear 3 in which the diameter of the addendum circle is 200 mm, the diameter of the dedendum circle is 190 mm, and the number of teeth is 40 will be described below.

(Operation of Rotation Detection Device)

Next, the operation in the first embodiment will be described with reference to FIGS. 1 to 4.

Figure 3:
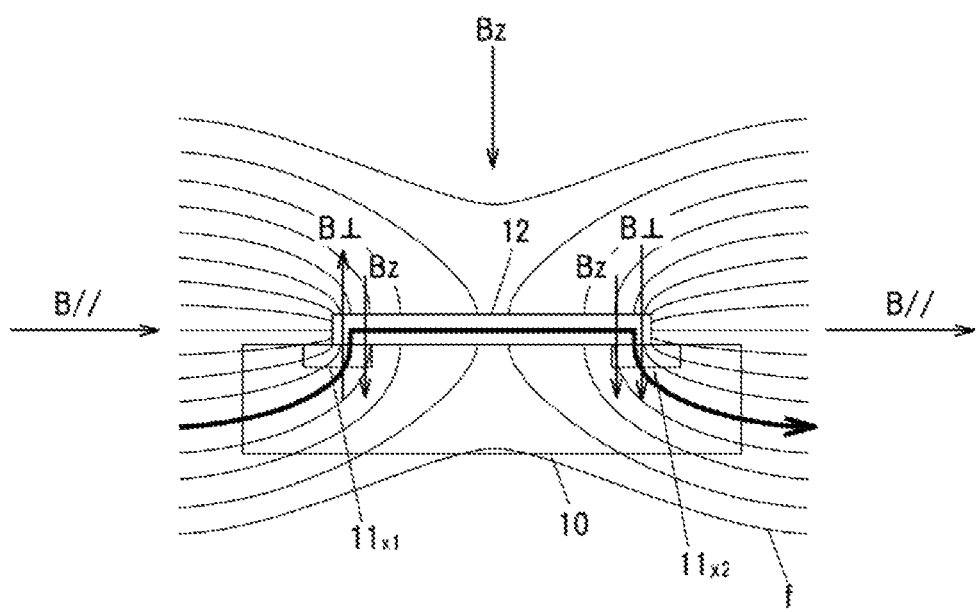
FIG. 3 is a schematic diagram for describing an operation of the sensor in the rotation detection device.

FIG. 3 is a schematic diagram for describing an operation of the sensor 1 in the rotation detection device 5.

The magnetic flux passing through the sensor 1 is detected by the Hall elements $11_{x1}$, $11_{x2}$, $11_{y1}$, and $11_{y2}$, and a signal proportional to the magnetic flux density is output. Hereinafter, the magnetic flux in the x direction, that is, the magnetic flux detected by the Hall elements $11_{x1}$ and $11_{x2}$, will be described as one representative example. However, the same is applied to the y direction.

In a magnetic flux f, a parallel component B// is induced to the magnetic concentrator 12, so that the magnitude of the magnetic flux density is converted into a vertical component $B_\perp$ which is proportional to the parallel component B//, and is measured by a pair of Hall elements $11_{x1}$ and $11_{x2}$. A vertical component $B_z$ is also measured by a pair of Hall elements $11_{x1}$ and $11_{x2}$.

Specifically, the Hall element $11_{x1}$ on the left side in the drawing measures "$B_\perp - B_z$", while the Hall element $11_{x2}$ on the right side in the drawing measures "$-B_\perp - B_z$". In the Y direction, the Hall elements $11_{y1}$ and $11_{y2}$ perform the measurement in the similar manner.

Therefore, if the difference between the output from the Hall element $11_{x1}$ and the output from the Hall element $11_{x2}$ is calculated, $2B_\perp$ is obtained, and if the sum of them is calculated, $-2B_z$ is obtained. In the description below, it is supposed that the sensor 1 outputs the difference (hereinafter referred to as $2B_{x\perp}$) between the output from the Hall element $11_{x1}$ and the output from the Hall element $11_{x2}$ and the difference (hereinafter referred to as $2B_{y\perp}$) between the output from the Hall element $11_{y1}$ and the output from the Hall element $11_{y2}$, and the rotation of the gear 3 is detected based on the $B_{x\perp}$ and $B_{y\perp}$.

A method for detecting the rotation of the gear 3 will be described below.

Figure 4:
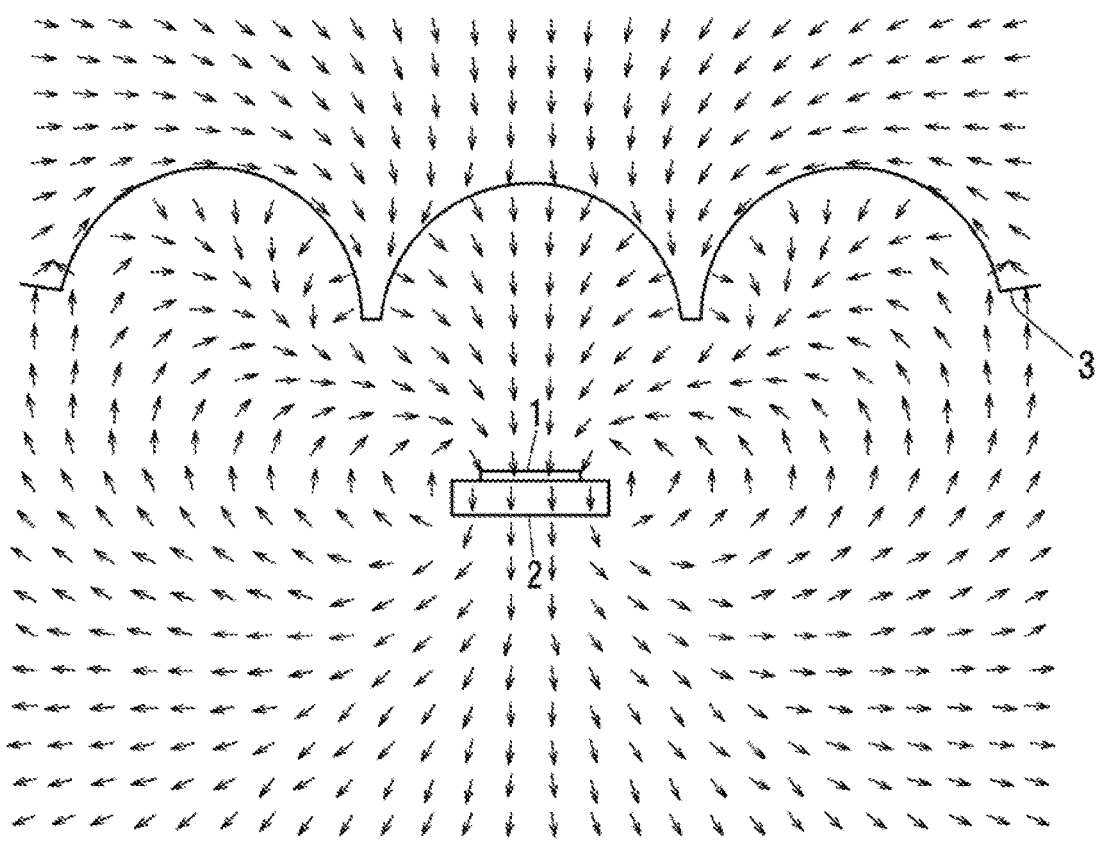
FIG. 4 is a schematic diagram illustrating a state of a magnetic field formed by a magnet.
Figure 5:
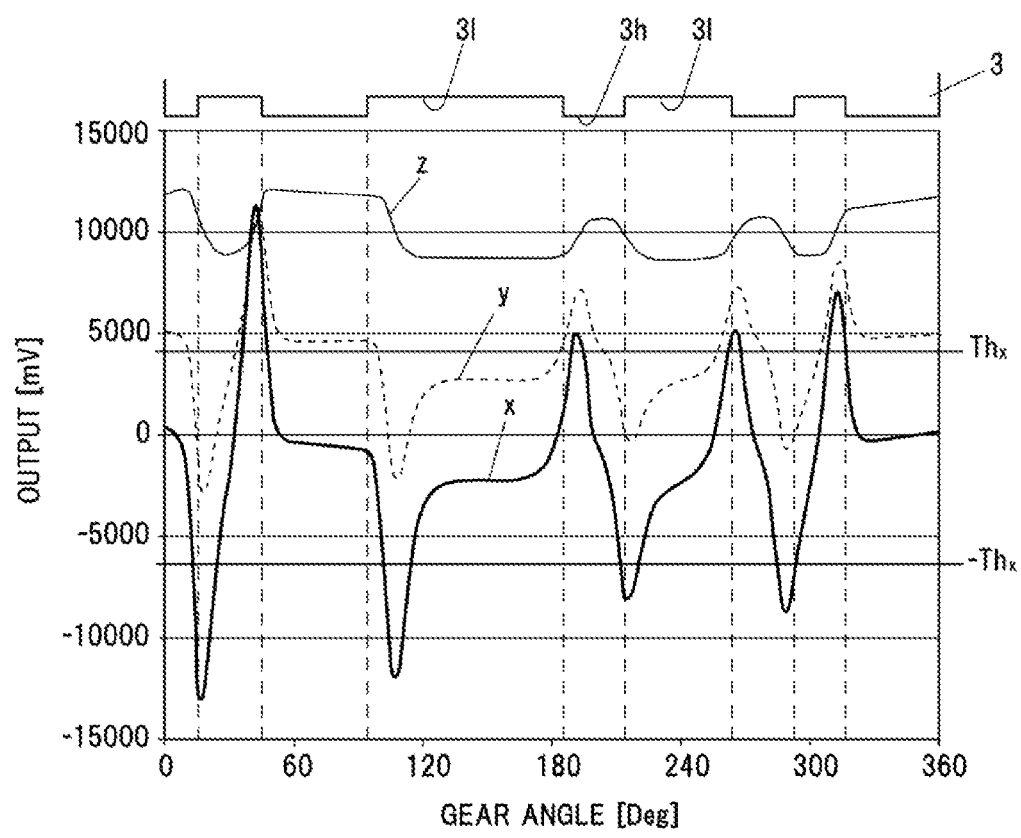
FIG. 5 is a graph illustrating an example of a variation in a signal output from the sensor as teeth of the gear pass.

FIG. 4 is a schematic diagram illustrating a state of a magnetic field formed by the magnet 2. FIG. 5 is a graph illustrating an example of a variation in a signal output from the sensor 1 as teeth of the gear pass.

While FIG. 4 shows that the interval between the tooth tip and the tooth root is constant relative to a rotation angle, FIG. 5 shows the example using a gear 30 in which the interval between a tooth tip 30h and a tooth root 30l is not constant relative to the rotation angle. The reason why the gear illustrated in FIG. 5 is used is to show that the characteristic of an output signal is invariable, although there is a variation in an output signal due to the interval between the tooth tip 30h and the tooth root 30l.

As illustrated in FIG. 4, with the state in which the tip of the tooth of the gear 3 is most separated from the sensor 1, a magnetic field symmetric with respect to the z axis is formed, and the x component of the magnetic flux density detected by the sensor 1 becomes zero. In addition, with the rotation of the gear 3 in the rotating direction $D_r$, the tooth on the left side in the drawing approaches, so that the x component is changed to be negative, and thus, the x component of the magnetic flux density detected by the sensor 1 assumes a negative value. Furthermore, with the state in which the tip of the tooth is the closest to the sensor 1, a magnetic field symmetric with respect to the z axis is formed, and the x component of the magnetic flux density detected by the sensor 1 becomes zero.

Furthermore, with the rotation of the gear 3 in the rotating direction $D_r$, the tooth passes over the sensor 1 to be away therefrom toward the left side in the drawing, and therefore, the x component is converted into positive from negative at the timing at which the tooth is passing, and is returned to zero as the gear 3 approaches the state in which the tip of the tooth is most separated from the sensor 1.

Specifically, as illustrated in FIG. 5, in the case in which the tooth passes over the sensor 1 with the rotation of the gear 30 and at the transition timing from the tooth root 30l to the tooth tip 30h, the output signal level from the sensor 1 becomes the maximum. Furthermore, at the transition timing from the tooth tip 30h to the tooth root 30l, the output signal level from the sensor 1 becomes the minimum. Therefore, values of which absolute values are smaller than the smallest values out of the maximum values and minimum values are respectively set as a positive threshold $Th_x$ and a negative threshold $-Th_x$. The rotating speed and the angular speed of the gear 3 can be calculated by counting the number of times in which the output signal from the sensor 1 exceeds the respective thresholds in positive and negative sides. In addition, even when the interval between the teeth is not constant, the edge of the teeth (the boundary between the tooth root 30l and the tooth tip 30h) of the gear 30 can be detected.

In addition, as illustrated in FIG. 5, the similar behavior is also detected as for the y component of the magnetic flux density detected by the sensor 1, whereby the rotating speed and the angular speed of the gear 30 can be calculated. Further, it is found from FIG. 5 that the output signal of the x component has greater dynamic range than the output signal of the z component which is shown in FIG. 5 for comparison and is obtained by a conventional differential system. Notably, the output signal of the z component obtained by the differential system is obtained under the condition in which a tooth has a right-angle shape. The dynamic range becomes smaller, under the condition in which a tooth has an angle or a curved surface.

(Effect of First Embodiment)

According to the first embodiment described above, $B_{x//}$ is converted into $B_{x\perp}$ by the magnetic concentrator 12, and $B_{x\perp}$ is output based on the difference between the outputs from the pair of Hall elements $11_{x1}$ and $11_{x2}$, whereby $B_{x//}$ which changes with the rotation of the gear 3 can be detected by the sensor 1 without increasing the distance between the Hall elements $11_{x1}$ and $11_{x2}$. Therefore, the influence of the distance between the Hall elements $11_{x1}$ and $11_{x2}$ on the shape of the sensor 1 can be reduced, and thus, the sensor IC can be made more compact than the conventional one. Note that, in the embodiment described above, the distance between the Hall elements $11_{x1}$ and $11_{x2}$ can be decreased to about 0.2 mm. This distance can be decreased more.

In addition, $B_{x//}$ is converted into $B_{x\perp}$ by the magnetic concentrator 12, and $B_{x\perp}$ is output based on the difference between the outputs from the pair of Hall elements $11_{z1}$ and $11_{x2}$, and further, the magnetic flux is attracted by the magnetic concentrator 12. Therefore, compared to the case in which the z component in the magnetic flux density is detected by a single Hall element having a detection direction in the z direction, the dynamic range is improved (if the magnetic concentrator 12 is not provided, a signal output from the Hall element by detecting the magnetic flux density in the z direction is smaller than the signal of the z component illustrated in FIG. 5). Since the dynamic range is improved, the air gap $D_g$ between the sensor and the gear 3 can be increased more than a sensor using a conventional Hall element or the like, whereby the freedom in the arrangement is improved, combined with the miniaturizing effect.

In addition, the distance $d_s$ between the Hall elements $11_{x1}$ and $11_{x2}$ can be decreased, whereby the size of the substrate 10 can be decreased. Accordingly, the number of chips which can be obtained from a single wafer during the manufacture can be increased, resulting in the reduction in the manufacturing cost of the sensor.

Second Embodiment

The second embodiment is different from the first embodiment in that a sensor 1a is used instead of the sensor 1 in the first embodiment. In the sensor 1a, the arrangement of magnetic detection elements and magnetic concentrators is changed. Note that the components same as those in the first embodiment are identified by the same reference signs.

Figure 6A:
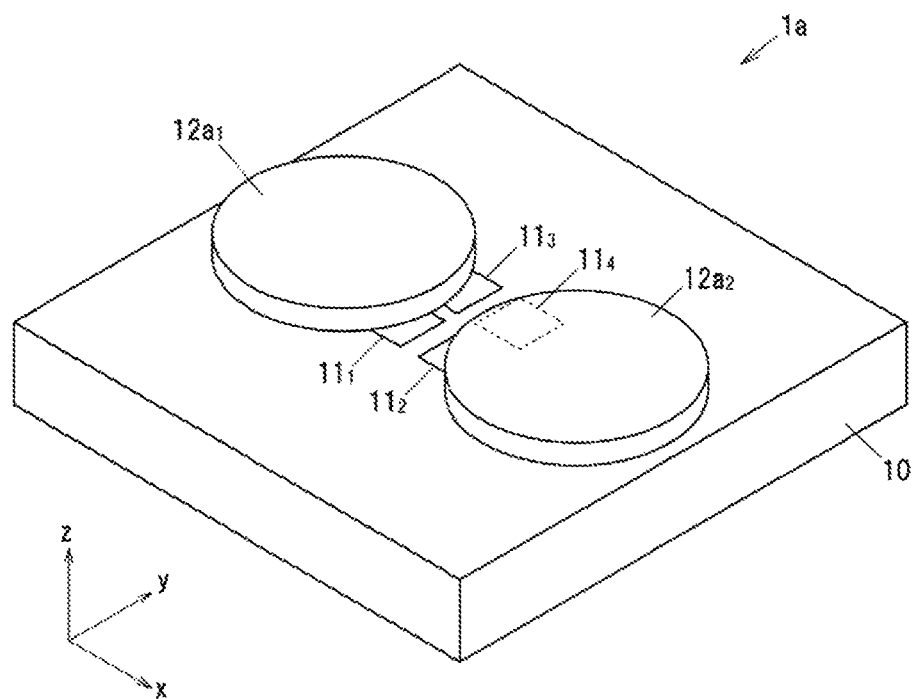
FIG. 6A is a perspective view and a side view illustrating an example of a configuration of a sensor in a rotation detection device according to a second embodiment.
Figure 6B:
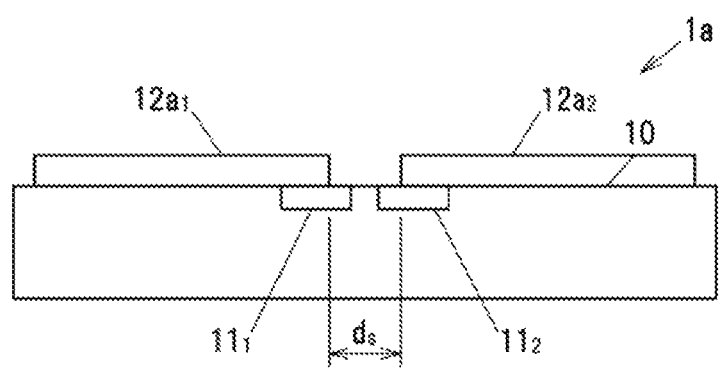
FIG. 6B is a perspective view and a side view illustrating an example of the configuration of the sensor in the rotation detection device according to the second embodiment.

FIGS. 6A and 6B are each a perspective view and a sectional view illustrating an example of the configuration of the sensor in a rotation detection device according to the second embodiment.

As illustrated in FIGS. 6A and 6B, as one example, the sensor 1a includes: a flat plate substrate 10 having a thickness in a z direction; Hall elements 111, 112, 113, and 114 having detection surfaces parallel to an xy plane, and having detection directions in the z direction as magnetic detection elements; a magnetic concentrator $12_{a1}$ that is mounted on the Hall elements 111 and 113 such that a portion thereof is overlapped with the Hall elements 111 and 113 and converts a magnetic flux in an x direction into a magnetic flux in the z direction for causing the Hall elements 111 and 113 to detect the converted magnetic flux; and a magnetic concentrator $12_{a2}$ that is mounted on the Hall elements 112 and 114 such that a portion thereof is overlapped with the Hall elements 112 and 114 and converts a magnetic flux in an x direction into a magnetic flux in the z direction for causing the Hall elements 112 and 114 to detect the converted magnetic flux, and this sensor 1a is a Hall IC that detects a magnetic flux density in the x and z directions.

The sensor 1a, which is a Hall latch switch sensor manufactured by Melexis, or the like, for example, obtains the difference between the output from Hall element 111 and the output from the Hall element 112 and the difference between the output from the Hall element 113 and the output from the Hall element 114, thereby being capable of obtaining outputs in proportion to the magnetic flux density in the x direction and the magnetic flux density in the y direction. In addition, the distance between the Hall elements 111 and 112 and the distance between the Hall elements 113 and 114 are set as ds=0.05 mm, and as a package, the thickness in the z direction is 1.5 mm, the width in the x direction is 4.1 mm, and the height in the y direction is 3 mm. Permalloy can be used for the magnetic concentrator 12 of the sensor 1a. In addition, the sensor 1a may have only the Hall elements 111 and 112.

(Operation of Rotation Detection Device)

Next, the operation in the second embodiment will be described with reference to FIGS. 6A, 6B, and 7.

Figure 7:
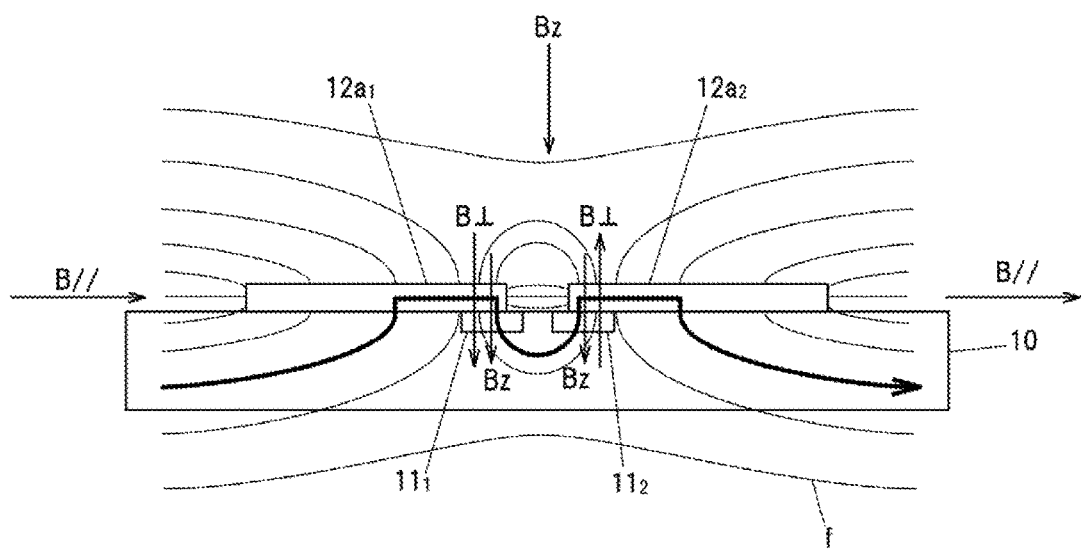
FIG. 7 is a schematic diagram for describing an operation of the sensor.

FIG. 7 is a schematic diagram for describing the operation of the sensor 1a.

The magnetic flux density applied to the sensor 1a is detected by the Hall elements 111, 112, 113, and 114. Hereinafter, the magnetic flux detected by the Hall elements 111 and 112 will be described as one representative example. However, the same is applied to the Hall elements 113 and 114.

In a magnetic flux f, a parallel component $B_{//}$ is induced to the magnetic concentrator 12, so that the magnitude of the magnetic flux density is converted into a vertical component $B_\perp$ which is proportional to the parallel component $B_{//}$, and is measured by a pair of Hall elements 111 and 112. A vertical component $B_z$ is also measured by a pair of Hall elements 111 and 112.

Specifically, the Hall element 111 on the left side in the drawing measures "$B_\perp + B_z$", while the Hall element 112 on the right side in the drawing measures "$-B_\perp + B_z$".

Therefore, if the difference between the output from the Hall element 111 and the output from the Hall element 112 is calculated, $-2B_\perp$ is obtained, and if the sum of them is calculated, $2B_z$ is obtained. The sensor 1a outputs the difference $B_\perp 12$ between the output from the Hall element 111 and the output from the Hall element 112 and the difference $B_\perp 34$ between the output from the Hall element 113 and the output from the Hall element 114, and detects the rotation of the gear 3 by calculating the average of $B_\perp 12$ and $B_\perp 34$.

The method for detecting the rotation of the gear 3 is similar to the method in the first embodiment, so that the description thereof will be omitted.

(Effect of Second Embodiment)

According to the second embodiment described above, the distance between the magnetic detection elements can be decreased more than the sensor 1 in the first embodiment. In addition, two magnetic concentrators $12_{a1}$ and $12_{a2}$ are provided in the detection direction, whereby the magnetic attraction effect is improved, and the dynamic range is further improved.

Meanwhile, the substrate with a size corresponding to the diameters of two magnetic concentrators as well as the distance between the magnetic detection elements is required. However, the size is about 0.4 to 0.7 mm, so that the sensor IC can be miniaturized as compared to the conventional one. In addition, the production cost can similarly be suppressed as compared to a prior art.

Other Embodiments

Note that the present invention is not limited to the embodiments described above, and various modifications are possible without departing from the spirit of the present invention.

In addition, the sensor, the magnet, and the gear described in the above-mentioned first and second embodiments are only illustrative, and a new combination may be made by appropriately selecting each of these components within a range not impairing the position detection function and not changing the spirit of the present invention.

INDUSTRIAL APPLICABILITY

A rotation detection device that has a miniaturized sensor IC in comparison with the prior art is provided.

REFERENCE SIGNS LIST 1 sensor
1a sensor
2 magnet
3 gear
3h tooth tip
3l tooth root
5 rotation detection device
10 substrate
$11_{x1}$ Hall element
$11_{x2}$ Hall element
$11_{y1}$ Hall element
$11_{y2}$ Hall element
12 magnetic concentrator
$12a_1$ magnetic concentrator
$12a_2$ magnetic concentrator
111 Hall element
112 Hall element
113 Hall element
114 Hall element

The invention claimed is:

1. A rotation detection device comprising:
a magnet configured to form a magnetic field toward a tooth surface of a gear; and
a sensor interposed between the gear and the magnet, the sensor comprising:
  a pair of magnetic detection elements arranged in a circumferential direction of the gear configured to detect a radial direction component and a radially-redirected circumferential direction component of the gear in a magnetic flux density, and output signals according to the magnetic flux density of the gear;
  at least one magnetic concentrator arranged partly overlapped on the pair of magnetic detection elements, configured to attract a circumferential direction component of the gear in the magnetic flux density and redirect the circumferential direction component of the gear in the magnetic flux density to the radial direction of the gear on detection surfaces of the magnetic detection elements so that the radially-redirected circumferential direction component of the gear in the magnetic flux density is detected by the pair of magnetic detection elements; and
  a signal processing circuit configured to process signals output from the pair of magnetic detection elements and detect the rotation of the gear, wherein,
  the circumferential direction component of the gear in the magnetic flux density is detected by the signal processing circuit based on a difference between the respective signals output from the pair of magnetic detection elements corresponding to the radial direction component and the radially-redirected circumferential direction component of the gear in the magnetic flux density, and the rotation of the gear is detected by counting a gear tooth number based on changes in the difference in a predetermined time.

2. The rotation detection device according to claim 1, wherein the at least one magnetic concentrator is disposed between the pair of magnetic detection elements.

3. The rotation detection device according to claim 1, wherein the at least one magnetic concentrator is disposed on each ends of the pair of magnetic detection elements.

4. The rotation detection device according to claim 1, the at least one magnetic concentrator further comprises a pair of magnetic concentrators, arranged apart from each other and in tandem along the circumference direction of the gear, wherein each magnetic concentrator is partly overlapped with the pair of magnetic detection elements that are arranged apart from each other.

5. The rotation detection device according to claim 1, wherein the pair of magnetic detection elements comprise a pair of Hall elements.

6. The rotation detection device according to claim 1, wherein the sensor comprises a magneto resistive sensor.

7. The rotation detection device according to claim 1, wherein the sensor comprises a multi-axis magnetic flux detection IC.

8. The rotation detection device according to claim 1, wherein an edge of a tooth of the gear is right angle.

9. The rotation detection device according to claim 1, wherein the magnetic concentrator comprises permalloy.

10. The rotation detection device according to claim 1, wherein the pair of magnetic detection elements are arranged apart from each other at 0.2 mm or less.

11. A rotation detection device comprising:
a magnet configured to form a magnetic field toward a tooth surface of a gear; and
a sensor interposed between the gear and the magnet, the sensor comprising:
a pair of magnetic detection elements arranged in a direction perpendicular to a circumferential direction of the gear and a radial direction of the gear configured to detect a radial direction component and a radially-redirected component of the gear in a magnetic flux density, and output signals according to a magnetic flux density of the gear in the radial direction;
at least one magnetic concentrator arranged partly overlapped on the pair of magnetic detection elements, configured to attract a component of the magnetic flux density that has a direction perpendicular to the circumferential direction of the gear and the radial direction of the gear and redirect the component of the magnetic flux density to the radial direction of the gear on detection surfaces of the magnetic detection elements so that the radially-redirected component of the gear in the magnetic flux density is detected by the pair of magnetic detection elements; and
a signal processing circuit configured to process signals output from the pair of magnetic detection elements and detect the rotation of the gear, wherein,
the component of the magnetic flux density that has the direction perpendicular to the circumferential direction of the gear and the radial direction of the gear is detected by the signal processing circuit based on a difference between the respective signals output from the pair of magnetic detection elements corresponding to the radial direction component and the radially-redirected component of the gear in the magnetic flux density, and the rotation of the gear is detected by counting a gear tooth number based on changes in the difference in a predetermined time.

12. The rotation detection device according to claim 11, wherein the at least one magnetic concentrator is disposed between the pair of magnetic detection elements.

13. The rotation detection device according to claim 11, wherein the at least one magnetic concentrator is disposed on each ends of the pair of magnetic detection elements.

14. The rotation detection device according to claim 11, wherein the pair of magnetic detection elements are arranged apart from each other at 0.05 mm.

15. The rotation detection device according to claim 11, further comprising a substrate on the magnet, wherein the sensor and the magnetic concentrator are disposed on the substrate, and the substrate has a size ranging 0.4 to 0.7 mm.

16. A rotation detection device comprising:
a magnet configured to form a magnetic field toward a tooth surface of a gear; and
a sensor interposed between the gear and the magnet, the sensor comprising:
a first magnetic detection element and a second magnetic detection element arranged in a circumferential direction of the gear, and configured to locally detect a radial direction component $B_x\perp$ and a radially-redirected circumferential direction component $B_x//$ of the gear in a magnetic flux density, and output signals according to the detected magnetic flux density of the gear;
at least one magnetic concentrator arranged partly overlapped on the pair of magnetic detection elements, configured to attract a circumferential direction component of the gear in the magnetic flux density and redirect the circumferential direction component of the gear in the magnetic flux density to the radial direction of the gear on detection surfaces of the first and the second magnetic detection elements so that the radially-redirected circumferential direction component $B_x//$ of the gear in the magnetic flux density is detected by the first and the second magnetic detection elements; and
a signal processing circuit configured to process signals output from the first and the second magnetic detection elements and detect the rotation of the gear, wherein,
the circumferential direction component of the gear in the magnetic flux density is detected by the signal processing circuit based on a difference between the signals output from each of the first and the second magnetic detection elements corresponding to a total of the radial direction component $B_x\perp$ and the radially-redirected circumferential direction component $B_x//$ of the gear in the magnetic flux density, and
the rotation of the gear is detected by based on changes in the difference in a predetermined time.

17. The rotation detection device according to claim 16, the sensor further comprising:
a third magnetic detection element and a fourth magnetic detection element arranged in a direction perpendicular to the circumferential direction of the gear and the radial direction of the gear configured to detect the radial direction component $B_y\perp$ and the radially-redirected component $B_y//$ of the gear in the magnetic flux density, and output signals according to the magnetic flux density of the gear in the radial direction, wherein
the at least one magnetic concentrator is further configured to attract a component of the magnetic flux density that has a direction perpendicular to the circumferential direction of the gear and the radial direction of the gear and redirect the component of the magnetic flux density to the radial direction of the gear on detection surfaces of the third and the fourth magnetic detection elements so that the radially-redirected component $B_y //$ of the gear in the magnetic flux density is detected by the third and the fourth magnetic detection elements; and
the signal processing circuit is further configured to process signals output from the third and fourth magnetic detection elements and detect the rotation of the gear, wherein,
the component of the magnetic flux density that has the direction perpendicular to the circumferential direction of the gear and the radial direction of the gear is detected by the signal processing circuit based on a difference between the respective signals output from the third and the fourth magnetic detection elements corresponding to a total of the radial direction component $B_y \perp$ and the radially-redirected component $B_y //$ of the gear in the magnetic flux density, and
the rotation of the gear is further detected based on changes in the difference between the respective signals output from the third and the fourth magnetic detection elements in a predetermined time.

18. The rotation detection device according to claim 4, further comprising another pair of magnetic detection elements disposed adjacent to the pair of magnetic detection elements, wherein the rotation of the gear is detected based on changes in an average of the difference in a predetermined time obtained from each pair of magnetic detection elements.

* * * * *